United States Patent
Kawanishi

(10) Patent No.: US 8,716,922 B2
(45) Date of Patent: May 6, 2014

(54) TUNING-FORK TYPE PIEZOELECTRIC VIBRATING PIECES AND DEVICES EXHIBITING REDUCED HAMPERING OF VIBRATION

(75) Inventor: Shingo Kawanishi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 528 days.

(21) Appl. No.: 13/076,359

(22) Filed: Mar. 30, 2011

(65) Prior Publication Data

US 2011/0241496 A1    Oct. 6, 2011

(30) Foreign Application Priority Data

Mar. 31, 2010   (JP) .................. 2010-079996
Feb. 23, 2011   (JP) .................. 2011-036699

(51) Int. Cl.
  *H01L 41/08*   (2006.01)
  *H03H 9/19*    (2006.01)
  *H03H 9/21*    (2006.01)
(52) U.S. Cl.
  CPC .. *H03H 9/19* (2013.01); *H03H 9/21* (2013.01)
  USPC ........................................................ 310/370
(58) Field of Classification Search
  CPC ............ H03H 9/19; H03H 9/21; H03H 9/215
  USPC ............................. 310/370; 333/200; 331/158
  See application file for complete search history.

(56) References Cited

U.S. PATENT DOCUMENTS 8,183,750 B2 * 5/2012 Yamada ........................ 310/370
2005/0062368 A1  3/2005 Hirasawa et al.

FOREIGN PATENT DOCUMENTS

JP   2007-049748 A   2/2007
JP   2007-096899     4/2007
JP   2008-178022     7/2008

OTHER PUBLICATIONS

Office Action for related Japanese Patent Application No. 2011-036699, 4 pages, dated Apr. 6, 2012.

* cited by examiner

*Primary Examiner* — Jaydi San Martin
(74) *Attorney, Agent, or Firm* — Klarquist Sparkman, LLP

(57) ABSTRACT

An exemplary tuning-fork type quartz-crystal vibrating piece includes a base, a pair of vibrating arms, and a connecting electrode electrically connectable to an internal conductive member of a package. The base and vibrating arms are made of a piezoelectric material. The vibrating arms extend in a prescribed direction from the base and have at least one excitation electrode that is electrically connected to the connecting electrode. Each vibrating arm has an upper and a lower axis main surface each defining a respective groove extending in the prescribed direction. Each vibrating arm also has axis edge-side surfaces extending between the first and second axis main surfaces. The excitation electrode includes a surface electrode located inside the grooves on the axis main surfaces of at least one vibrating arm and a side electrode located on the axis edge-side surfaces of the at least one vibrating arm. The surface connecting electrode.

7 Claims, 14 Drawing Sheets

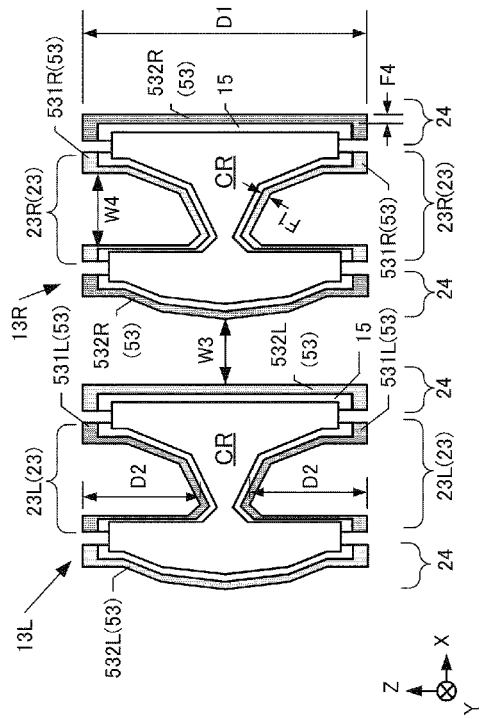
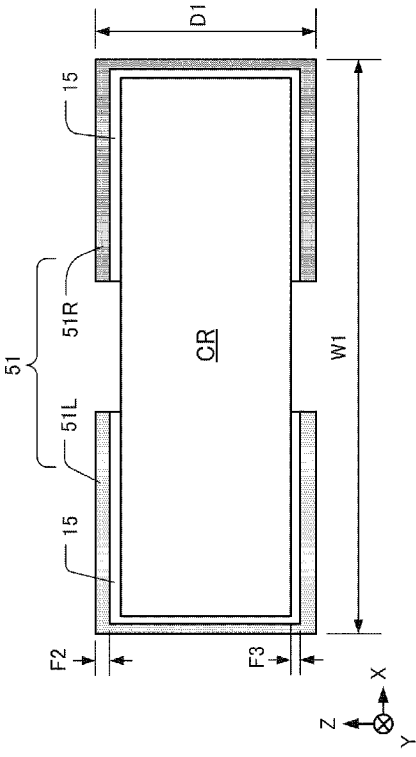
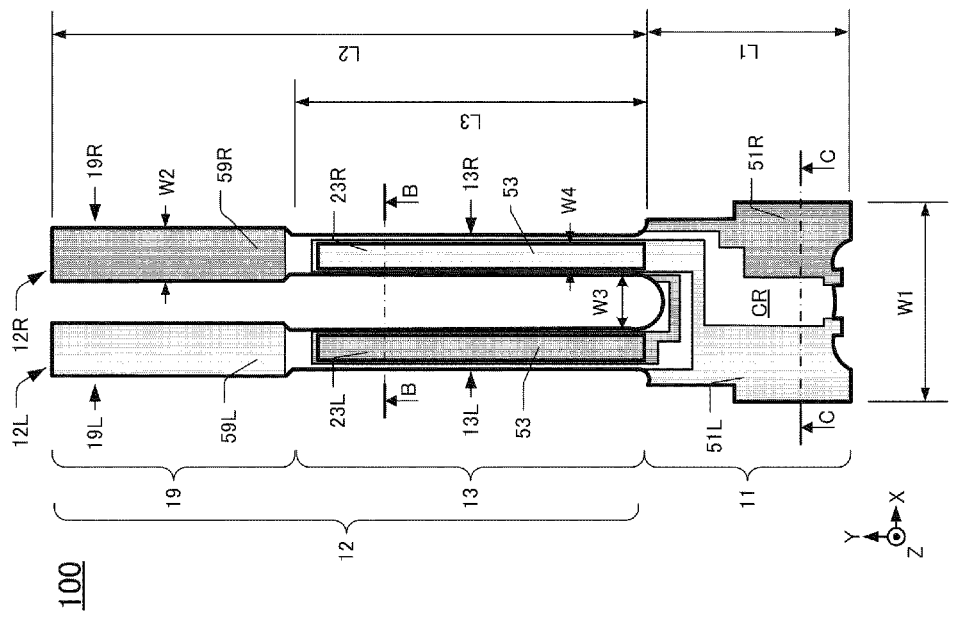

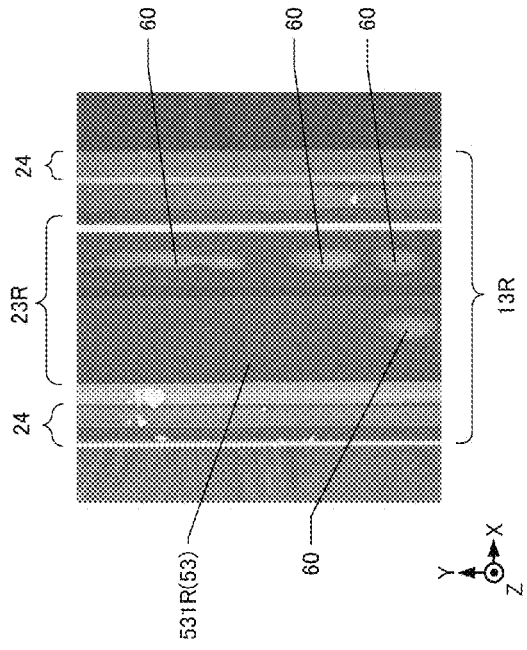
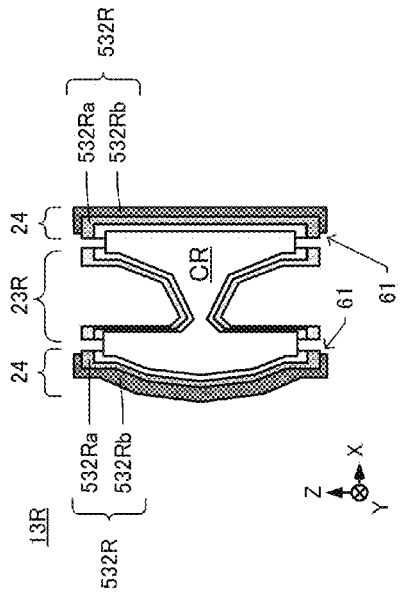
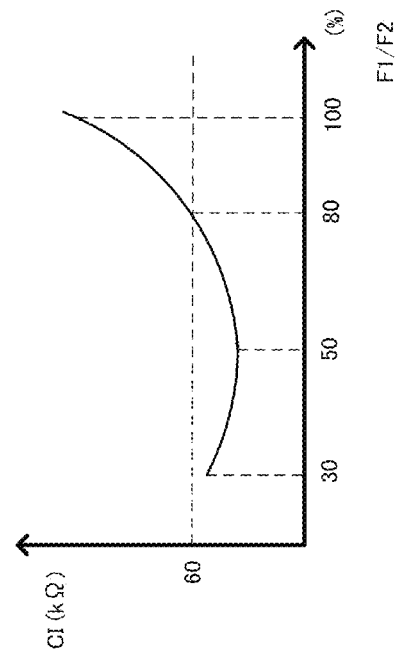
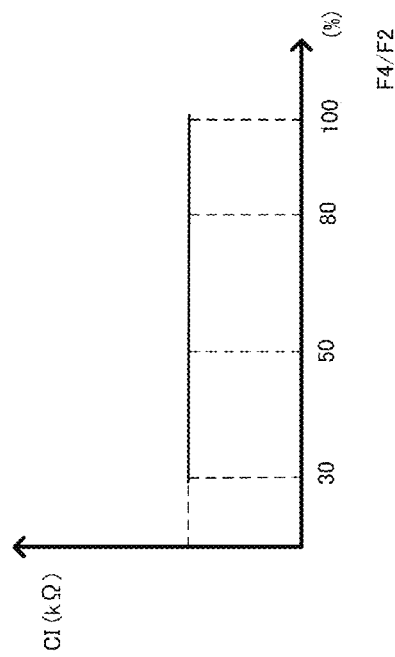
FIG.2A
FIG.2B
FIG.2C
FIG.2D

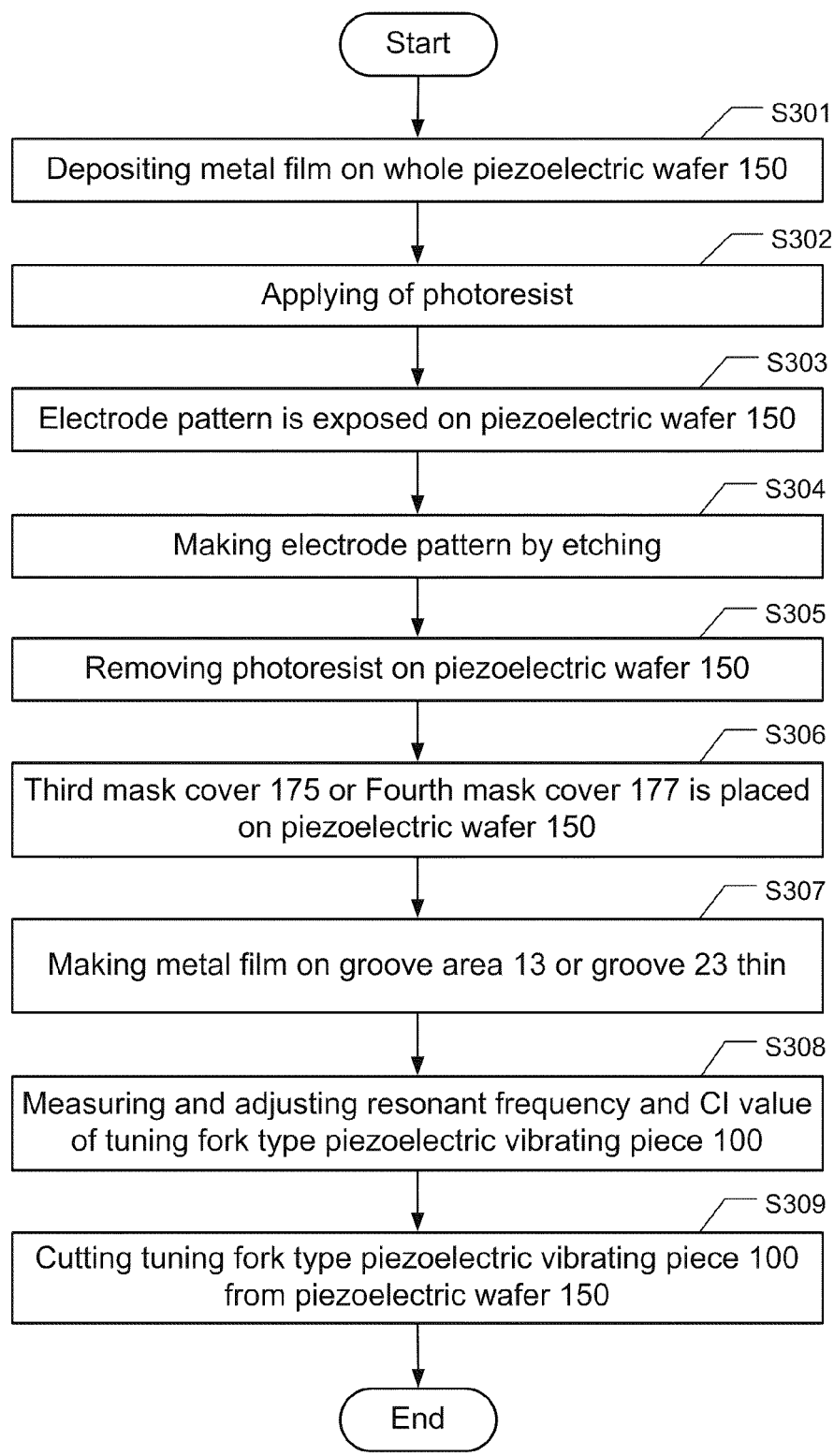

FIG.9A
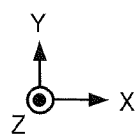
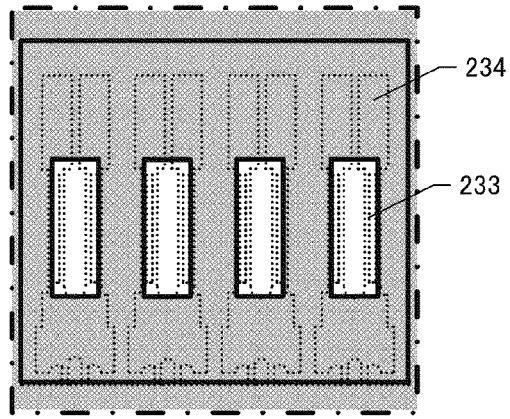
FIG.9B
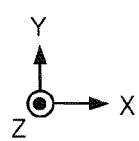
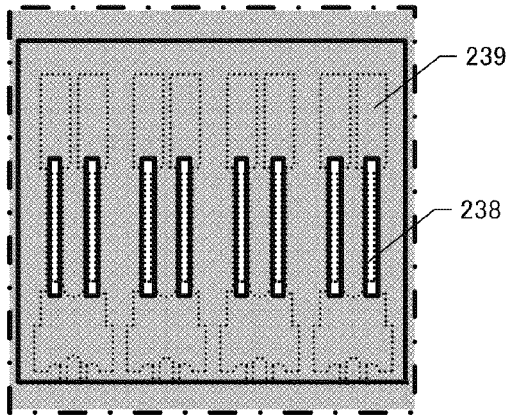

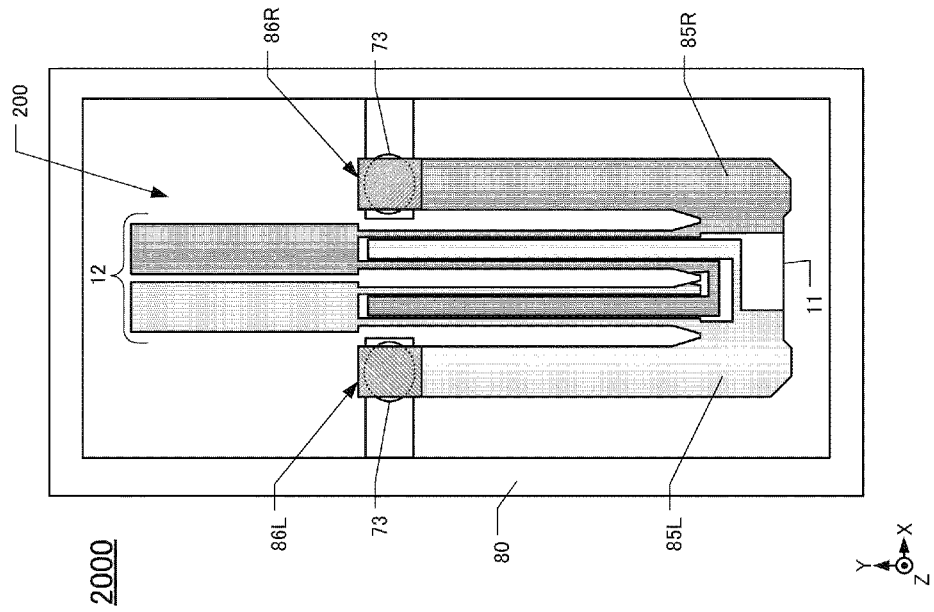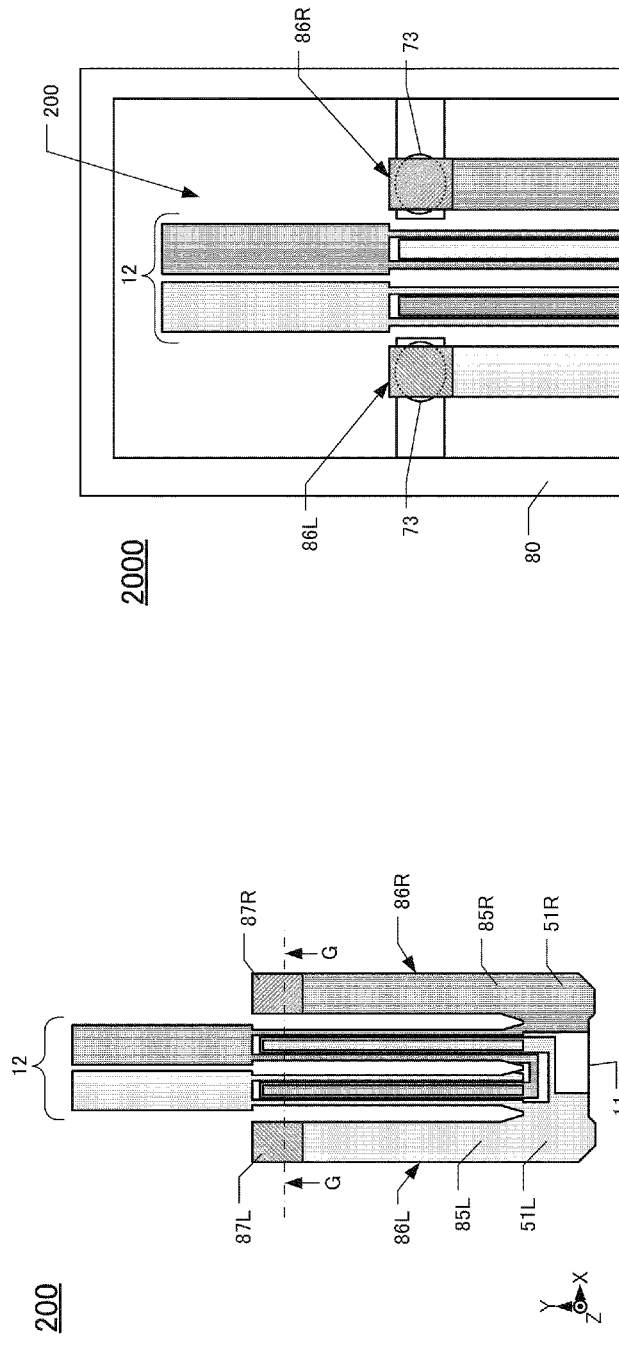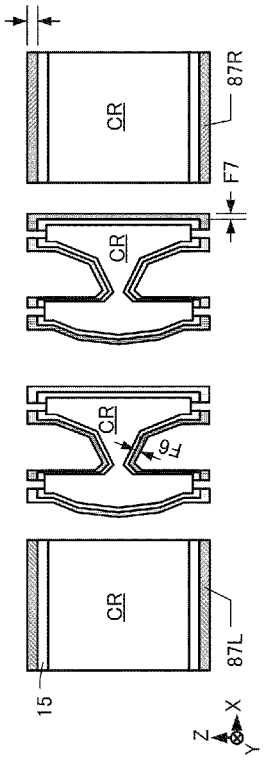
FIG.13A
FIG.13B
FIG.13C

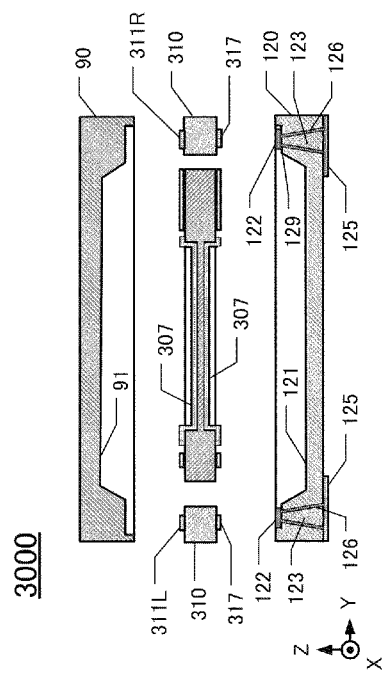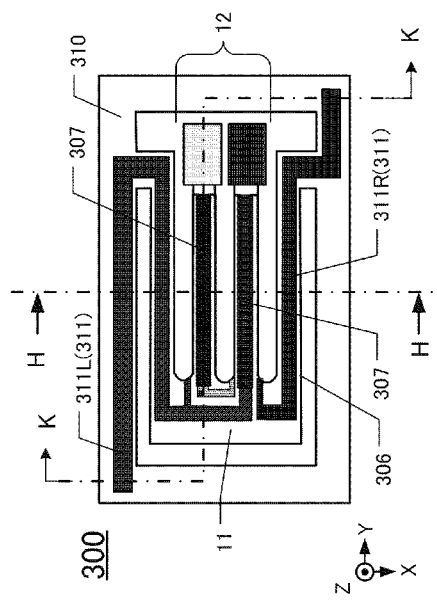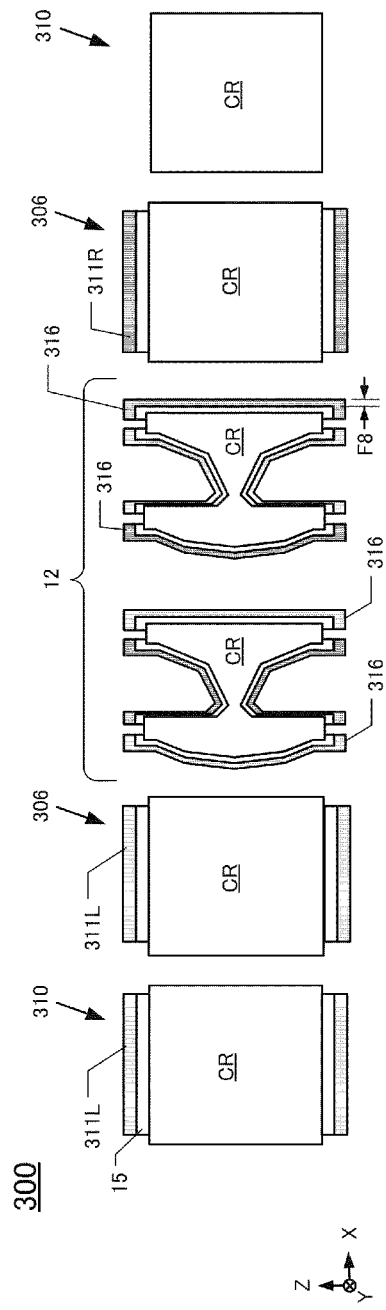
FIG.14A
FIG.14B
FIG.14C

TUNING-FORK TYPE PIEZOELECTRIC VIBRATING PIECES AND DEVICES EXHIBITING REDUCED HAMPERING OF VIBRATION

CROSS-REFERENCE TO RELATED APPLICATION

This application claims priority to and the benefit of Japan Patent Application No. 2010-079996, filed on Mar. 31, 2010, and Japan Patent Application No. 2011-036699, filed on Feb. 23, 2011, in the Japan Patent Office, the disclosures of which are incorporated herein by reference in their respective entireties.

FIELD

This disclosure pertains to, inter alia, tuning-fork type piezoelectric vibrating pieces comprising respective pairs of vibrating arms on which grooves are formed, and piezoelectric devices including such piezoelectric vibrating pieces.

DESCRIPTION OF THE RELATED ART

Japan Unexamined Patent Application No. 2008-178022 discusses a tuning-fork type piezoelectric vibrating piece having a desired reduced CI (Crystal impedance). The vibrating piece includes a pair of vibrating arms each having a respective excitation electrode situated on respective grooves defined in the upper and lower axis main surfaces of the arms. Each vibrating arm also includes a respective excitation electrode formed on the axis edge-side surfaces of the arm. The excitation electrodes are divided into four regions in cross-section. The thicknesses of the four regions are adjusted to reduce factors that hamper vibrations. Also, stresses are decreased to reduce their impact on the frequency of vibrations produced by the arms. Thus, the tuning-fork type piezoelectric vibrating pieces resist increases in CI and exhibit reduced adverse effects on vibration frequency.

The JP '022 reference provide no description of how to adjust the thicknesses of the four regions of the excitation electrodes. It is difficult to adjust the thicknesses of these four regions.

Among its various advantages, the current invention provides tuning-fork type piezoelectric vibrating pieces (and piezoelectric devices comprising same) having fewer factors that could hamper vibrations. The subject pieces and devices also prevent CI increases by allowing easy adjustment of the electrodes on the vibrating arms.

SUMMARY

The invention provides, inter alia, tuning-fork type quartz-crystal vibrating pieces. An exemplary embodiment of such a piece comprises a base, a pair of vibrating arms, and a connecting electrode electrically connectable to an internal conductive member of a package. The base and vibrating arms are made of a piezoelectric material. The vibrating arms extend in a prescribed direction from the base and comprise at least one excitation electrode that is electrically connected to the connecting electrode. Each vibrating arm comprises upper and lower "axis main surfaces" each defining a respective groove extending in the prescribed direction. Each vibrating arm also comprises "axis edge-side surfaces" extending between the first and second axis main surfaces. The excitation electrode includes a surface electrode located inside the grooves on the axis main surfaces of at least one vibrating arm and a side electrode located on the axis edge-side surfaces of the at least one vibrating arm. The surface electrode has a respective film thickness that is less than a film thickness of the connecting electrode.

In most embodiments the connecting electrode and the at least one excitation electrode each comprise a first metal layer formed on the piezoelectric material and a second metal layer formed on the first metal layer. In these embodiments the second metal layer of the surface electrodes is thinner than the second metal layer of the connecting electrode. By way of example, the film thickness of the surface electrode is 20% to 90% of the film thickness of the connecting electrode.

The location of the connecting electrode is not limiting. For example, it can be situated on the base.

The piezoelectric vibrating piece can further comprise a pair of supporting arms. Each supporting arm extends in the prescribed direction from the base outboard of the respective vibrating arm. Each supporting arm comprises a distal end that includes a respective connecting electrode.

The surface electrodes can be thinned, after their initial formation, by etching in an inert gas atmosphere, by laser irradiation, or by metal etching.

A tuning-fork type piezoelectric vibrating piece according to another embodiment comprises a base, a pair of vibrating arms, and first and second excitation electrodes. The base is made of a piezoelectric material. The vibrating arms are also made of the piezoelectric material and extend in a prescribed direction from the base. Each vibrating arm comprises an upper axis main surface and a lower axis main surface and axis edge-side surfaces extending between the first and second axis main surfaces. The excitation electrodes each include a respective surface electrode on the upper and lower axis main surfaces of the respective vibrating arm and a respective side electrode on the axis edge-side surfaces of the respective vibrating arm. The side electrodes have a respective film thickness configured so that a turnover temperature of the piezoelectric vibrating piece, as revealed in a temperature-versus-vibration frequency profile for the piezoelectric vibrating piece, is at a desired value based on data regarding a correspondence relationship between the film thickness of the side electrode or the film thickness of the surface electrode and the turnover temperature in the temperature-versus-frequency profile.

In some embodiments the film thickness of the side electrode or of the surface electrode is greater whenever the turnover temperature is higher than the desired value of the turnover temperature. The side electrode or the surface electrode can be thickened by localized vacuum-deposition or sputtering, for example.

In other embodiments the film thickness of the side electrode or of the surface electrode is less whenever the turnover temperature is lower than the desired value of the turnover temperature. The side electrode or the surface electrode can be thinly formed, after its initial formation, by etching in an inert-gas atmosphere, by laser irradiation, or by metal etching.

In many embodiments the excitation electrode comprises a first metal layer formed on the piezoelectric material and a second metal formed on the first metal layer. The thickness of the second metal layer of the side electrode or the surface electrode is adjusted after formation of the respective electrode.

According to another aspect, piezoelectric devices are provided that comprise a tuning-fork type piezoelectric vibrating piece as summarized above, and a package housing the piezoelectric vibrating piece.

Tuning-fork type piezoelectric vibrating pieces, or piezoelectric devices comprising same, exhibit reduced hampering of vibration and prevent increases in CI.

BRIEF DESCRIPTION OF THE DRAWINGS

FIG. 1A is a plan view of a first embodiment of a tuning-fork type piezoelectric vibrating piece.

FIG. 1B is a cross-sectional view along the line B-B in FIG. 1A.

FIG. 1C is a cross-sectional view along the line C-C in FIG. 1A.

FIG. 2A is a graph showing, for the first embodiment of a tuning-fork type piezoelectric vibrating piece, the relationship between CI and the ratio of film thickness of the second metal layer of the groove to the film thickness of the second metal layer of the base (i.e., F1/F2).

FIG. 2B is a graph showing, for the first embodiment of a tuning-fork type piezoelectric vibrating piece, the relationship between CI and the ratio of film thickness of the second metal layer on the axis edge-side surface to the film thickness of the second metal layer of the base (i.e., F4/F2).

FIG. 2C is a photograph of the right groove area after thinning the second metal layer of the groove by laser irradiation.

FIG. 2D is a cross-sectional view of the right groove area after the increasing the thickness of the second metal layer on the axis edge-side surface by sputtering.

FIG. 8 is a flow-chart of an embodiment of a method for forming electrodes on the first embodiment of a tuning-fork type piezoelectric vibrating piece.

FIG. 9A is an enlargement of a portion of a third mask cover used in, for example, the method shown in FIG. 8.

FIG. 9B is an enlargement of a portion of a fourth mask cover used in, for example, the method shown in FIG. 8.

FIG. 13A is a plan view of a second embodiment of a tuning-fork type piezoelectric vibrating piece.

FIG. 13B is a cross-section along the line G-G in FIG. 13A.

FIG. 13C is a cross-section of an embodiment of a piezoelectric device as viewed in the −Z-axis direction.

FIG. 14A is a plan view of a third embodiment of a tuning-fork type piezoelectric vibrating piece.

FIG. 14B is a schematic cross-section, along the line K-K in FIG. 14A, of the third embodiment of a piezoelectric device, before assembly.

FIG. 14C is a cross-section, along the line H-H of FIG. 14A, of the third embodiment of a tuning-fork type piezoelectric vibrating piece.

DETAILED DESCRIPTION

Figure 3A:
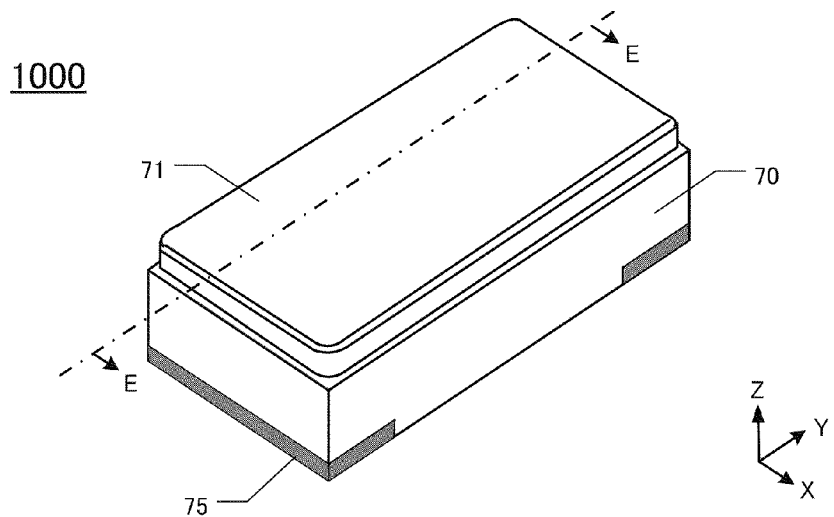
FIG. 3A is an oblique perspective view of a first embodiment of a piezoelectric device comprising a tuning-fork type piezoelectric vibrating piece.

Representative embodiments are described below with reference to the accompanying drawings. In this regard, the scope of the present invention is not limited to these embodiments unless the respective description indicates otherwise.

First Embodiment of Tuning-Fork Type Piezoelectric Vibrating Piece

FIG. 1 is used as a reference for describing this embodiment 100 of a tuning-fork type piezoelectric vibrating piece. FIG. 1A is a plan view of this embodiment. FIG. 1B is a cross-section of this embodiment along the line B-B in FIG. 1A. FIG. 1C is a cross-section of this embodiment along the line C-C in FIG. 1A. As referred to herein, the direction to which the vibrating arms 12 extend is called the Y-direction, the direction along which the vibrating arms 12 line up is called the X-direction (which is perpendicular to the X-direction. The direction orthogonal to the X-direction and Y-direction is called the Z-direction.

The first embodiment of a tuning-fork type piezoelectric vibrating piece 100 comprises a base 11 and a pair of vibrating arms 12 extending parallel to each other from the base 11 in the Y-direction. The left vibrating arm is denoted 12L, and the right vibrating arm is denoted 12R. The vibrating arms 12L, 12R have respective upper and lower "axis main surfaces" and left and right "axis edge-side surfaces." The substrate material of this embodiment 100 is piezoelectric material CR, of which examples include crystal material (e.g., quartz crystal), lithium tantalite, and lithium niobate.

The vibrating arms 12 have a groove region 13, of which the groove region for the left arm is denoted 13L, and the groove region for the right arm is denoted 13R. In the groove region 13L, the left arm 12L defines respective grooves 23L on its upper and lower axis main surfaces, and the right arm 12R defines respective grooves 23R on its upper and lower axis main surfaces. The grooves 23L, 23R extend in the Y-axis direction. Flanking the grooves 23L, 23R are respective axis edge-side surfaces 24. On the distal end of each vibrating arm 12L, 12R is a respective weight 19L, 19R situated in a weight region 19.

As the first embodiment is progressively miniaturized, the vibration frequency produced by the vibrating arms 12L, 12R tends to increase. The weights 19L, 19R serve to decrease the vibration frequency of the vibrating arms 12L, 12R while stabilizing their vibrations. Respective excitation electrodes, discussed later below, formed in the grooves 23L, 23R prevent increases in CI (Crystal Impedance).

The base 11 has a Y-direction length L1 in the range of, for example, 0.58 mm to 0.64 mm. Each vibrating arm 12L, 12R has a Y-axis direction length L2 in the range of, for example, approximately 1.45 mm to 1.65 mm. Thus, length L1 of the base 11 is approximately 40% of the length L2 of the vibrating arms 12. The Y-axis direction length L3 of the groove region 13 is in the range of, for example, 0.87 mm to 1.12 mm, which is approximately 60% to 70% of the length L2 of the vibrating arms 12.

The X-axis direction width W1 of the base 11 is in the range of, for example, approximately 0.42 mm to 0.50 mm. The X-axis direction width W2 of the weight region 19 is in the range of, for example, approximately 0.08 mm to 0.12 mm. The distance W3 between the right groove region 13R and the left groove region 13L is in the range of, for example, approximately 0.1 mm to 0.15 mm. The X-axis direction width W4 of each groove 23L, 23R is in the range of, for example, approximately 0.07 mm to 0.1 mm, which is approximately 80% of the width of the respective vibrating arm 12L, 12R.

The Z-axis direction thickness D1 of the first embodiment of a tuning-fork type piezoelectric vibrating piece 100 is in the range of, for example, approximately 0.08 mm to 0.12 mm. The Z-axis direction depth D2 of each groove 23L, 23R in the groove region 13 is in the range of, for example, 30% to 45% of the thickness of the respective vibrating arm 12L, 12R, which yields an actual depth dimension in the range of 0.03 mm to 0.045 mm, respectively.

The base 11 comprises two electrodes 51L, 51R formed on each axis main surface thereof and on the outwardly facing axis edge-side surfaces (see FIG. 1C). The left electrode 51L extends into the grooves 23R of the right arm 12R and into the weight region 19L of the left arm. The left electrode 51L also extends along the axis edge-side surfaces of the left arm 12L. The right electrode 51R extends into the groove 23L of the left arm 12L and into the weight region 19R of the right arm 12R. The right electrode 51R also extends along the axis edge-side surfaces of the right arm 12R. The electrodes 51L, 51R desirably comprise gold (Au) or silver (Ag). But, these elements are difficult to apply directly to the surface of a piezoelectric material CR. Consequently, each electrode 51L, 51R comprises a first metal layer 15 comprising chromium (Cr) or nickel (Ni) formed on the surface of the piezoelectric material CR, and a second metal layer 53 (Au or Ag) applied over the first metal layer. (In FIG. 1B the second metal layer 53 has several denotations, depending on location, including 531L, 532L, and 59L on the left arm 12L, and 531R, 532R, and 59R on the right arm 12R.) Hence, each electrode 51L, 51R comprises the first metal layer 15 and the second metal layer (51, 59, 531, 532).

The first metal layer 15 has a film thickness F3 (FIG. 1C) of, for example, 50 Å to 200 Å. The film thickness F3 is uniform on the base 11, the groove region 13, and the weight region 19. Depending upon the particular piezoelectric material CR used and/or on the arrangement of the piezoelectric material CR inside a vacuum-deposition device or sputtering system, the film thickness F3 may vary. In any event the film thickness F3 of the first metal layer 15 is desirably as low as possible. The thickness of the second metal layer (51, 59, 531, 532) is discussed later below.

A respective excitation electrode 53 is situated in each groove region 13 of each vibrating arm 12. In this region each excitation electrode 53 is divided, as shown in FIG. 1B. As a result, the excitation electrode 53 on the left arm 12L includes respective second metal layers 531L situated in each groove 23L and also includes respective second metal layers 532R on the +X and −X axis edge-side surfaces of the right arm 12R. Similarly, the excitation electrode 53 on the right arm 12R includes respective second metal layers 531R situated in each groove 23R and also includes respective second metal layers 532L on the +X and −X axis edge-side surfaces of the left arm 12L.

On the base 11 the electrodes 51L, 51R also include the second metal layer. FIG. 1C shows that the second layer 51L, 51R is applied over and is coextensive with the first metal layer 15, extending over respective regions on each of the axis main surfaces (+Z and −Z axis main surfaces) of the base 11 as well as on the outwardly facing edge-side surfaces.

In FIGS. 1A-1C, the second metal layer 51R on the base 11 is electrically connected to the second metal layer 532R on the side edge surfaces of the left arm 12L, to the second metal layer 59R in the weight region 19 of the right arm 12R, and to the second metal layer 531L of the grooves 23L of the left arm 12L. Similarly, the second metal layer 51L on the base 11 is electrically connected to the second metal layer 532L on the side edge surfaces of the right arm 12R, to the second metal layer 59L in the weight region 19 of the left arm 12L, and to the second metal layer 531R of the grooves 23R of the right arm 12R. In FIGS. 1A-1C, similarly hatched or shade regions are energized at the same respective electrical potential.

The weight region 19 includes a respective weight region 19L on the left arm 12L and a respective weight region 19R on the right arm 12R. Thus, the second metal layer 59 of the left arm 12L includes the second metal layer 59L of the left weight region 19L, and the second metal layer 59R of the right arm 12R includes the second metal layer 59R of the right weight region 19R.

To cause vibration of this first embodiment of a tuning-fork type piezoelectric vibrating piece 100, respective electrical voltages are applied to the second metal layers 51R, 51L on the base 11. When so energized, this embodiment 100 vibrates at a resonance frequency of, for example, 32.768 kHz.

Relationship of CI to Electrode Thickness

As shown in FIG. 1B or FIG. 1C, the second metal layers 531L, 531R in the grooves 23 have a film thickness F1, the second metal layers 51L, 51R on the base 11 have a film thickness F2, and the second metal layers 532L, 532R on the axis edge-side surfaces have film thickness F4. In this regard, depending on the prevailing conditions of sputtering or vacuum-deposition used to form the second metal layers, the respective film thicknesses F1, F2, and F4 vary in each region. For example, as shown in FIG. 1B, each groove 23 includes surfaces extending mainly in the Z-axis direction and other surfaces extending mainly in the X- or Y-axis direction. During sputtering, the film thickness F1 of the groove surface extending mainly in the Z-axis direction tends to be lower than the film thickness F1 extending mainly in the X- or Y-axis direction. (As used herein, the film thickness F1 denotes the average thickness of the entire second metal layer 531 in a groove 23.)

The second metal layers 51L, 51R on the base 11 have a film thickness F2 generally 500 Å or more, for example, 500 Å to 2000 Å. The first embodiment of a tuning-fork type piezoelectric vibrating piece 100 is affixed to the base 11 by the second metal layer 51L, 51R that connect to respective connecting terminals 74 inside a package 70 (see FIGS. 3B and 3C). To ensure electrical connections between the second metal layer 51L, 51R on the base 11 and the respective connecting terminals 74, the film thickness F2 of the second metal layer 51L, 51R is substantial. If the film thickness F2 is less than 500 Å, the electrical resistance across the connections is increased, which increases the CI excessively. To avoid excess production cost, the film thickness F2 of the second metal layer 51L, 51R is preferably 2000 Å or less.

FIG. 2A is a graph showing the relationship between CI and F1/F2 for this embodiment 100. In FIG. 2A, by changing the film thickness F1 of the second metal layer 531 in the grooves 23 while keeping F2 fixed, the value of F1/F2 is varied while measuring CI. Meanwhile, the film thickness F4 of the second metal layer 532L, 532R on the axis edge-side surfaces is kept constant. As indicated in FIG. 2A, CI is lowest when F1/F2 is approximately 50%. If the film thickness F1 of the second metal layer 531L, 531R in the grooves 23 is greater than prescribed, then vibrations produced by the piezoelectric material CR are disturbed or hampered, which increases CI. If the film thickness F1 is too low, then electrical resistance increases, which increases CI. If F1/F2 is approximately between 30% to 80%, CI is below 60 kΩ, which is a good value. If F2=1000 Å, then F1 desirably is approximately 300 Å to 800 Å.

If the film thickness F2 of the second metal layer 51L, 51R on the base 11 is kept at 500 Å, the film thickness F1 of the second metal layer 531L, 531R in the grooves 23 is desirably in the range of 150 Å to 450 Å. This value of F1 is in the range of 30% to 90% of F2. If F2=2000 Å, then F1 desirably is in the range of 400 Å to 800 Å, in which event F1 is in the range of 20% to 40% of F2. Therefore, whenever the film thickness F2 of the second metal layer 51L, 51R is in the range of 500-2000 Å, the film thickness F1 of the second metal layer 531L, 531R desirably is in the range of 20% to 90% of F2.

Whenever an electrical voltage is applied to the second metal layers in the groove 23, the weight region 19 of the vibrating arms 12 vibrates in the X-axis direction. During this vibration, if F1 is excessive, vibration of the weight region 19 is easily disturbed. I.e., if the excitation electrode 53 is excessively thick, adverse effects thereof on vibration of the vibrating arms 12 become substantial. For this reason, the film thickness F1 of the second metal layer 531L, 531R in the grooves 23 is preferably less than the film thickness F2 of the second metal layer 51L, 51R on the base 11. However, if F1 is less than 20% of F2, then CI is increased significantly.

FIG. 2B shows the relationship, in the first embodiment 100, between CI and the ratio F4/F2, wherein F4 is the film thickness of the second metal layer 532L, 532R on the axis edge-side surfaces and F2 is the film thickness of the second metal layer 51L, 51R on the base 11. In FIG. 2B, by changing F4 while keeping F2 fixed, F4/F2 is varied while CI is being measured. Meanwhile, the film thickness F1 of the second metal layer 531L, 531R in the grooves 23 is fixed. In FIG. 2B, even if F4 is varied, CI remains constant.

FIG. 2A shows that it is possible to reduce CI by adjusting the film thickness F1 of the metal layers 531L, 531R in the grooves 231. Thus, CI reduction can be achieved by adjusting only F1. This allows adjustment of the thickness of the second metal layer in all the groove region 13, including the film thicknesses F1 and F4, because the film thickness F4 does not relate to CI (FIG. 2B).

During thickness adjustment, the thickness of a second metal layer can be reduced by dry-etching in an inert-gas atmosphere (e.g., argon), sublimating a metal film by laser irradiation, or metal-etching using a combination of photolithography and wet-etching (using a mask). For example, FIG. 2C is a photograph of the right groove region 13R while a portion of the second metal layer 531R is being removed by laser irradiation. In FIG. 2C, some regions 60 of the second metal layer 531R in the groove are being sublimated by laser irradiation. If the thickness of a second metal layer is reduced by dry-etching, laser irradiation, or metal etching, etc., the surface of the metal layer becomes roughened. It is also possible to adjust the film thickness F4 in the same way.

It is also possible to increase the thickness of a metal layer by performing localized sputtering or vacuum-deposition, etc. For example, FIG. 2D is a cross-section of the right groove region 13R after the film thickness F4 of the second metal layer 532R has been increased by sputtering. FIG. 2D shows an initial second metal layer 532Ra on the sides of the groove in the right groove region 13R. Also visible is a second metal layer 532Rb formed over the initial second metal layer 532Ra by sputtering. Finally the second metal layer 532R on the axis edge-side surface of the groove is formed. In FIG. 2D, a bump 61 is made at the boundary of the second metal layer 532Ra with the second metal layer 532Rb on the axis edge-side surface. The film thickness F1 of the second metal layer 531R in the groove 23R can be adjusted in the same manner.

Metal-layer thicknesses can be adjusted using the foregoing methods, including adjusting CI and adjusting the turn-over temperature zero-temperature coefficient ("ZTC"; described later below). Adjustments of CI and of the turnover temperature zero-temperature coefficient are desirably performed after calculating a desired thickness of the second metal layer based on data related to layer-thickness data shown in FIGS. 2A, 10B, 10C as described below, CI, and turnover temperature zero-temperature coefficient.

First Embodiment of Piezoelectric Device

Figure 3B:
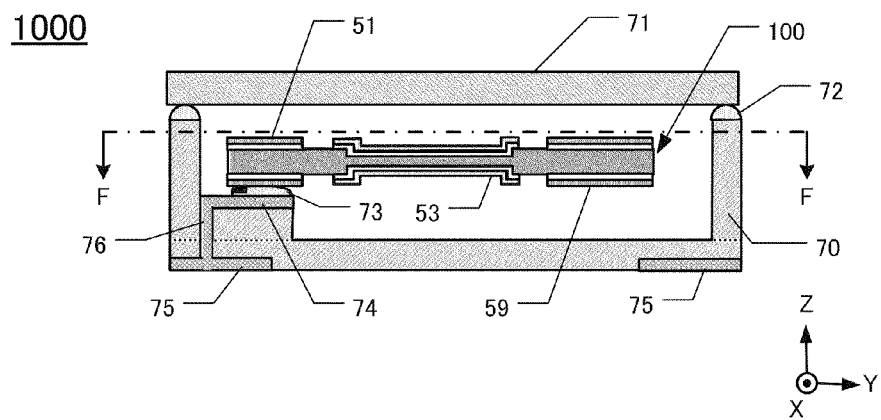
FIG. 3B is a cross-sectional view along the line E-E in FIGS. 3A and 3C.
Figure 3C:
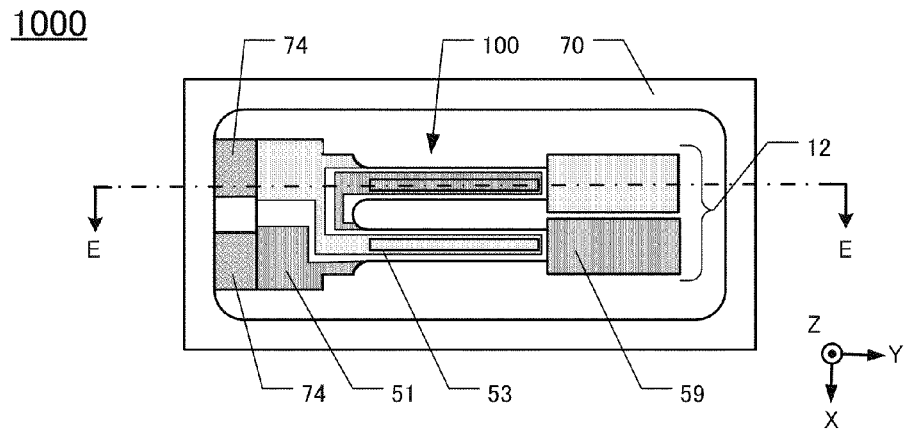
FIG. 3C is a cross-sectional view of the first embodiment of a piezoelectric device along the line F-F in FIG. 3B.

In this embodiment of a piezoelectric device the first embodiment of a tuning-fork type piezoelectric vibrating piece 100 is enclosed in a "package." This embodiment is shown in FIG. 3, which is an oblique perspective view of the device 1000. FIG. 3B is a cross-section of the piezoelectric device 1000 along the line E-E in FIGS. 3A and 3C. FIG. 3C is a cross-section of the piezoelectric device 1000 along the line F-F in FIG. 3B. The piezoelectric device 1000 comprises a package 70, a lid 71, and a tuning-fork type piezoelectric vibrating piece 100 according to the first embodiment. The package 70 is a concave box made of a ceramic-based material. The package 70 comprises at least one connecting terminal 74 located inside the package (one connecting terminal 74 for each metal film 51L, 51R on the base 11). The connecting terminal 74 is electrically connected to a relay terminal 75 on the outer surface of package 70 via a conductor 76 inside the wall of the package 70. The relay terminal 75 is electrically connectable to a respective conductor on a printed circuit board (not shown) by solder or the like. The lid 71 is a metallic plate that hermetically seals the package 70. The lid 71 and package 70 are sealed together using an appropriate sealant.

The first embodiment of a tuning-fork type piezoelectric vibrating piece 100 is mounted inside the cavity formed by the lid 71 and the package 70. As noted above, the piezoelectric vibrating piece 100 has two regions on the base 11 that include a second metal layer 51L, 51R. These regions function as connecting electrodes that are connected inside the package 70 to respective connecting terminals 74 using electrically conductive adhesive 73 or solder. The electrically conductive adhesive 73 is applied to the respective regions of the second metal layer 51L, 51R on the base 11 and the piezoelectric vibrating piece 100 is mounted to the electrically conductive adhesive 73.

Embodiments of Methods for Electrode Formation

The electrodes can be formed on the tuning-fork type piezoelectric vibrating piece 100 by any of several possible methods. Three methods of electrode formation are described below, with reference to respective flow-charts.

Figure 4:
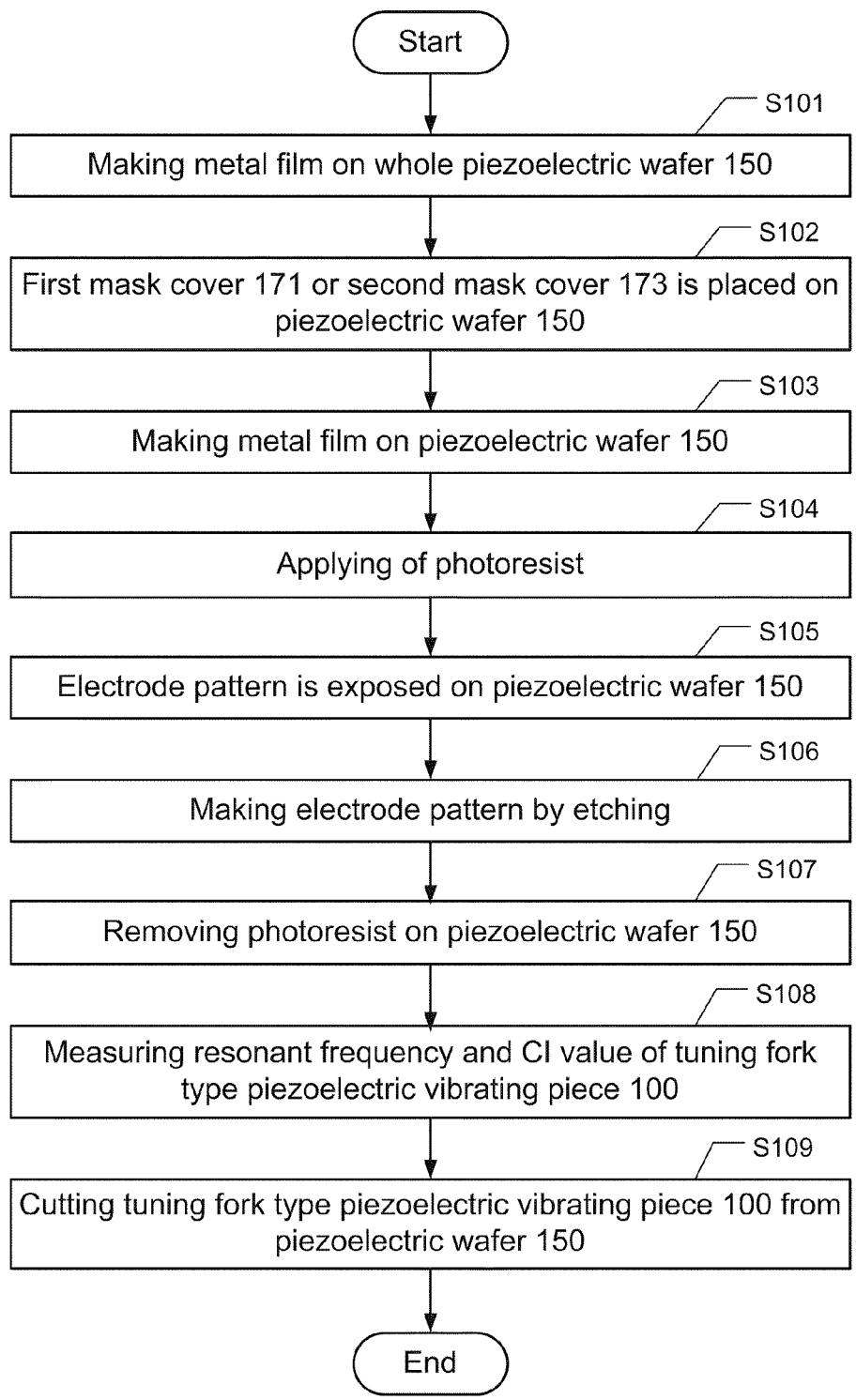
FIG. 4 is a flow-chart of an embodiment of a method for forming electrodes on the first embodiment of a tuning-fork type piezoelectric vibrating piece.
Figure 6A:
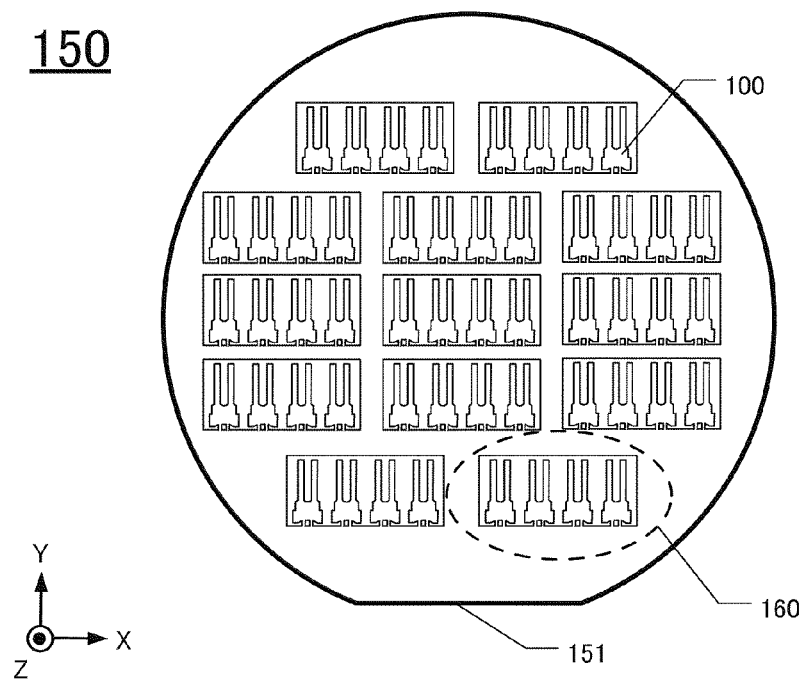
FIG. 6A is a plan view of a piezoelectric wafer comprising multiple tuning-fork type piezoelectric vibrating pieces, according to the first embodiment, formed thereon.
Figure 6B:
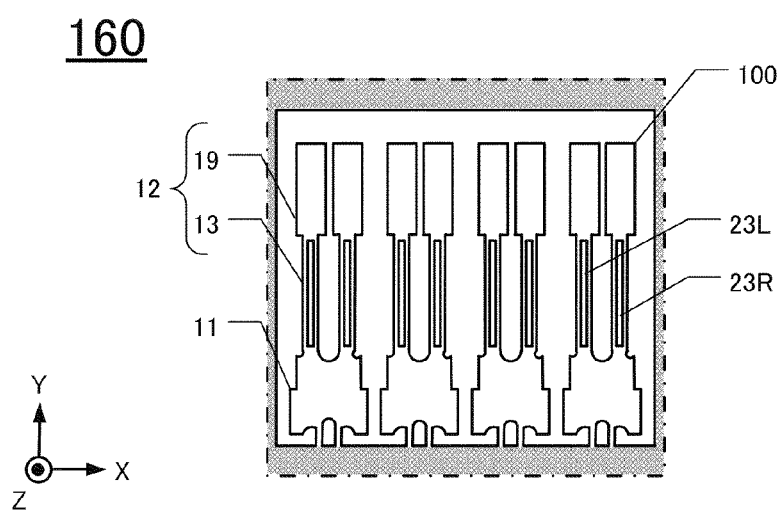
FIG. 6B is an enlargement of the region 160 in FIG. 6A.
Figure 7A:
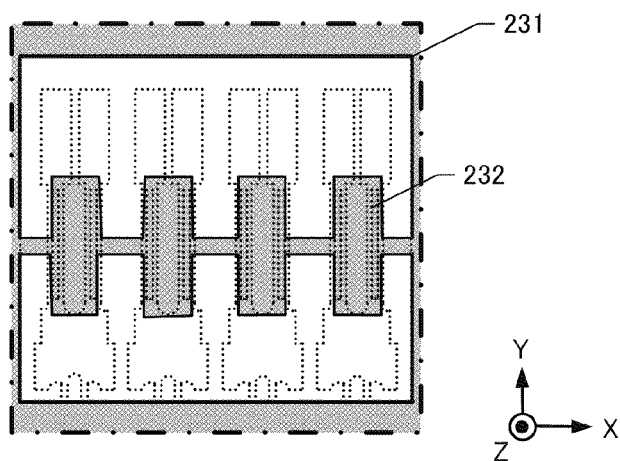
FIG. 7A is an enlargement of a portion of the first mask cover used in, for example, the method shown in FIG. 4.
Figure 7B:
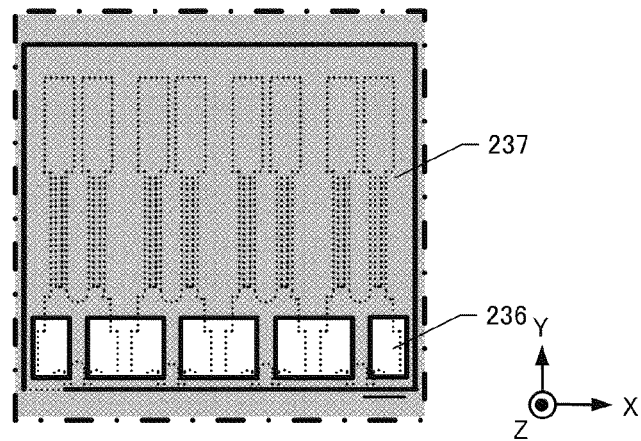
FIG. 7B is an enlargement of a portion of the second mask cover used in, for example, the method shown in FIG. 5.

FIG. 4 outlines a first embodiment of a method for forming the electrodes. FIG. 6A is a plan view of a piezoelectric wafer 150 on which multiple units of the tuning-fork type piezoelectric vibrating piece 100 are formed. FIG. 6B is an enlarged view of the region circumscribed by the dashed line 160 in FIG. 6A. FIG. 7A is an enlarged view of a portion of a first mask cover 171, and FIG. 7B is an enlarged view of a portion of a second mask cover 173. In FIGS. 7A-7B, the plan profiles of several units of the first embodiment of a tuning-fork type piezoelectric vibrating piece 100 are denoted by dotted lines.

FIGS. 4, 6A-6B, and 7A-7B are referred to below in the description of the first embodiment of a method for forming electrodes on the tuning-fork type piezoelectric vibrating piece 100. In FIG. 4, multiple units of the tuning-fork type piezoelectric vibrating piece 100 at the start of the flow chart are in the condition shown in FIG. 6A, showing multiple piezoelectric vibrating pieces 100 formed on a piezoelectric wafer 150. In FIG. 6B, the profile outlines of four tuning-fork type piezoelectric vibrating pieces 100 are shown. Also shown are the grooves 23 on the vibrating arms 12. The piezoelectric wafer 150 is made of, for example, synthetic quartz crystal having a thickness of, for example, 0.12 mm. The wafer diameter is 3 inches or 4 inches. The edge of the wafer 150 includes an orientation flat 151 that serves as a reference for determining the axis-direction of the crystal lattice.

Referring now to FIG. 4, in step S101, a first metal layer and a second metal are formed on the entire axis main surface (one or both sides) of the piezoelectric wafer 150 by vacuum-deposition or sputtering. The first metal layer 15 (FIGS. 1B and 1C) is first, followed by formation of the second metal layer on the first layer 15. The second metal layer is formed with a thickness of, for example, approximately 400 Å.

In step S102 a first mask cover 171 and/or second mask cover 173 is placed on the piezoelectric wafer 150. The mask cover is placed so that it registers with the enlarged region 160 shown in FIG. 6B. The mask cover is used for forming the metal layers in desired regions on the surface(s) of the piezoelectric wafer 150. If metal layers are to be formed simultaneously on both axis main surfaces of the piezoelectric wafer 150 at once, a first mask cover 171 is placed on one axis main surface and a second mask cover 173 is placed on the other axis main surface.

In FIG. 7A the area 231 of the first mask cover 171 is an aperture region, and the areas 232 are masked regions. The areas 232 cover the groove regions 13 of the tuning-fork type piezoelectric vibrating piece 100 to prevent forming the metal layers in the groove regions 13. The area 231 permits lamination of the metal layers on the base 11 and in the weight regions 19. In FIG. 7B the areas 236 of the second mask cover 173 are apertured regions, and the area 237 is a masked region. The area 237 covers the groove regions 13 of the piezoelectric vibrating piece 100 to prevent forming the metal layers in the groove regions 13. The areas 236 permit lamination of the metal layers on the base 11.

In step S103 a metal film (of first and second metal layers) is formed on the piezoelectric wafer 150 by sputtering or the like, as guided by the mask. With respect to the first mask cover 171, the metal film (in which the second metal layer has an exemplary thickness of 600 Å) is laminated on the base 11 and in the weight regions 19, as determined by the area 231 of the first mask cover 171. The metal film is not laminated in the groove regions 13. With respect to the second mask cover 173, the metal film (having an exemplary thickness of 600 Å) is laminated on the base 11, as determined by the regions 236 of the second mask cover 173. The metal film is not laminated in the groove regions 13. These laminations of metal films using the first mask cover 171 or second mask cover 173 are continued to form second metal layers 531L, 531R in the grooves 23 at a thickness of approximately 400 Å, and to form second metal layers 51L, 51R on the base 11 having a thickness of approximately 1000 Å.

In step S104 photoresist is applied on the entire surface of the second metal layer by spraying or spin-coating. Then, the photoresist is cured to harden it.

In step S105 a photomask (not shown) is prepared that defines the electrode patterns. Using the photomask, the desired electrode patterns are exposed on the photoresist on the piezoelectric wafer 150. The electrode patterns are exposed on both axis main surfaces of the piezoelectric wafer 150 since respective electrodes are required on both axis main surfaces of the piezoelectric vibrating pieces 100.

In step S106 after the exposed photoresist film is developed, the exposed regions of the photoresist are removed. The remaining photoresist film defines the desired electrode patterns. Using the exposed photoresist as a mask, unnecessary metal is removed from the metal film by wet-etching. For example, if the metal used for the second metal layer is gold and metal used for the first metal layer 15 is chromium, gold can be etched using an aqueous solution of iodine and potassium iodide, and chromium can be etched using an aqueous solution of diammonium hexanitratoacetate and acetic acid.

In step S107 remaining photoresist on the surfaces of the piezoelectric wafer 150 is removed. Through these steps, the first metal layer and second metal layer are formed on the piezoelectric vibrating piece 100 in desired locations.

In step S108 the respective resonance frequencies and CI values of the tuning-fork type piezoelectric vibrating pieces 100 on the piezoelectric wafer 150 are measured. With respect to a particular piezoelectric vibrating piece 100, if the resonance frequency is not as specified, the frequency can be adjusted by irradiating the weight region 19 using a laser having a wavelength and sufficient energy to sublimate the metal film.

In step S109 the piezoelectric vibrating pieces 100 are cut from the piezoelectric wafer 150 to separate the individual pieces.

Figure 5:
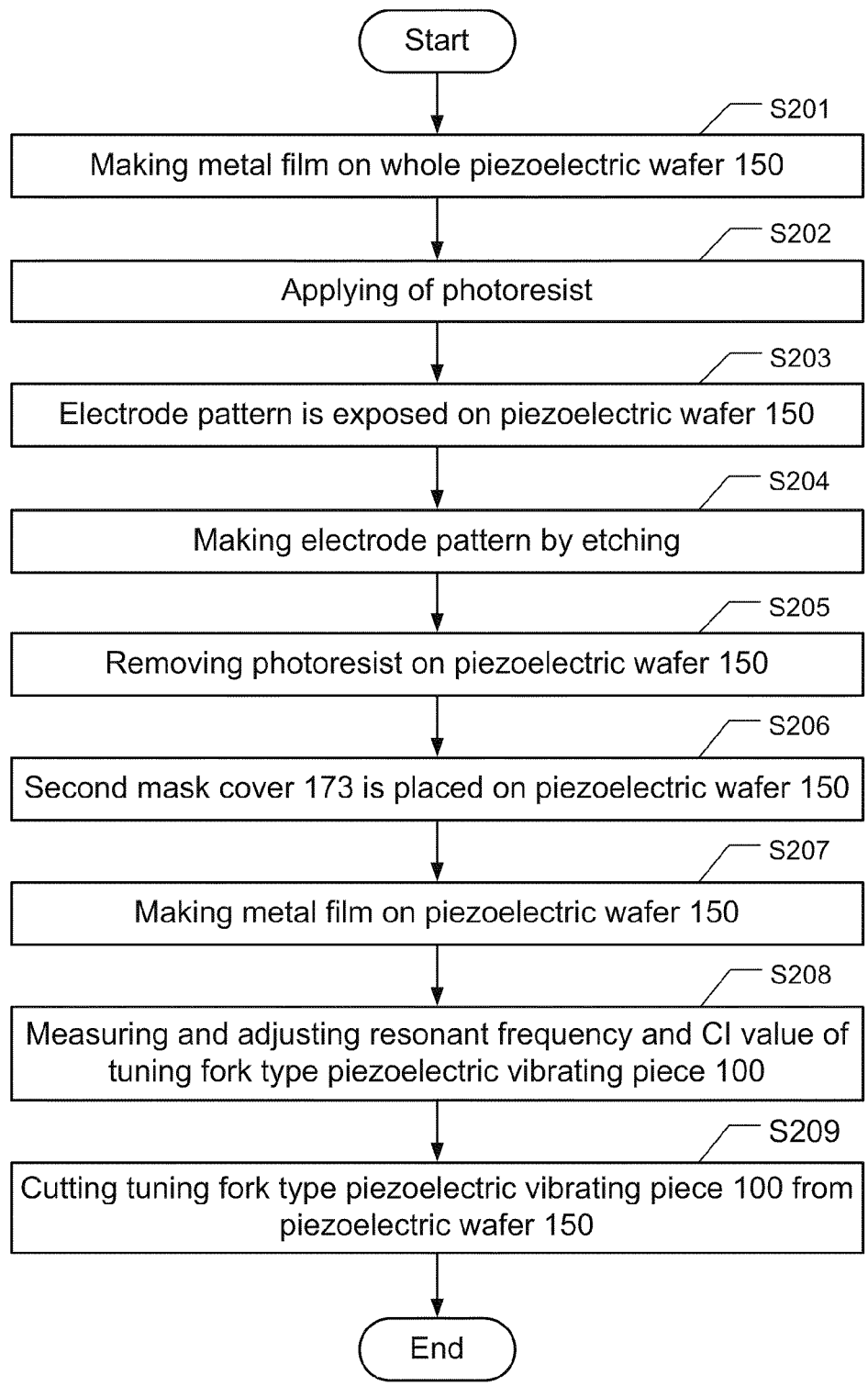
FIG. 5 is a flow-chart of a second embodiment of a method for forming electrodes on the first embodiment of a tuning-fork type piezoelectric vibrating piece.

FIG. 5 is a flow-chart of another embodiment of a method for forming electrodes on the first embodiment of a tuning-fork type piezoelectric vibrating piece 100. FIGS. 5 and 7B are used below in the description of this embodiment.

In step S201 first and second metal layers are formed on the entire axis main surfaces of the piezoelectric wafer 150 by vacuum-deposition or sputtering. The second metal layer metal film is formed having a thickness of approximately 400 Å, for example.

In step S202 photoresist is applied to the entire axis main surfaces of the second metal layer.

In step S203 electrode patterns are exposed on the photoresist film.

In step S204 after developing the photoresist film, the exposed photoresist is removed and unnecessary metal film is removed by etching.

In step S205 remaining photoresist on the piezoelectric wafer 150 is removed. By these process steps, the first and second metal layers are formed as electrodes on the piezoelectric vibrating piece 100.

In step S206 a second mask cover 173 is placed on the axis main surface of the piezoelectric wafer 150 in regions in which the first and second metal layers still remain. The second mask cover 173 is placed so that it registers with the enlarged regions 160 on the piezoelectric wafer 150, as shown in FIG. 6B.

In FIG. 7B, one apertured region 236 of the second mask cover 173 permits lamination of the metal film on the second metal layer 51L on the base 11 of one piezoelectric vibrating piece 100 and on the second metal layer 51R of an adjacent piezoelectric vibrating piece 100 (see FIG. 1).

In step S207 the metal film (first and second metal layers) is formed on the axis main surface of the piezoelectric wafer 150 by sputtering, etc. As controlled by the regions 236 of the second mask cover 173, a metal film (in which the second metal layer has a thickness of, for example, 600 Å) is formed on the second metal layer 51R, 51L on the bases 11. Metal film is not formed between the second metal layers 51R and 51L on any single piezoelectric vibrating piece 100, thereby eliminating possible shorts therebetween. In the resulting metal films laminated as controlled by the second mask cover 173, the film thickness F1 of the second metal layers 531L, 531R in the grooves 13 is approximately 400 Å, and the film thickness F2 of the second metal layers 51L, 51R on the base 11 is approximately 1000 Å.

In step S208 the resonance frequency and CI values of the piezoelectric vibrating pieces 100 on the piezoelectric wafer 150 are measured and adjusted as required.

In step S209 individual piezoelectric vibrating pieces 100 are cut from the piezoelectric wafer 150.

FIG. 8 depicts the flow-chart of a third embodiment of a method for forming electrodes on tuning-fork type piezoelectric vibrating pieces 100. The method is described below with reference to FIGS. 8 and 9A-9B. FIG. 9A is an enlargement of a region of a third mask cover 175 defining a region to be etched, and FIG. 9B is an enlargement of a region of a fourth mask cover 177 as used for controlling etching. In FIGS. 9A-9B, the profile outlines of tuning-fork type piezoelectric vibrating pieces 100 are denoted using dotted lines.

In step S301 the first metal layer and second metal layer of a metal film are formed on the entire axis main surface (both sides) of the piezoelectric wafer 150 by vacuum-deposition or sputtering. The second metal layer is formed having an exemplary thickness of approximately 1000 Å.

In step S302 photoresist is applied to the entire axis main surface of the second metal layer.

In step S303 electrode patterns are exposed on the photoresist.

In step S304 after the exposed photoresist film is developed, exposed regions of the photoresist film are removed. Then, unnecessary metal film is removed by wet-etching.

In step S305 remaining photoresist is removed from the piezoelectric wafer 150. By these steps, the first and second metal layers are formed in desired regions of the piezoelectric vibrating pieces 100.

In step S306 a third mask cover 175 and/or fourth mask cover 177 is placed on respective axis main surfaces of the piezoelectric wafer 150 in regions in which the first and second metal layers have been formed. The third and/or fourth mask cover 175, 177 is placed so that it registers with the enlarged regions 160 on the piezoelectric wafer 150 (FIG. 6B).

As shown in FIG. 9A, the region 233 of the third mask cover 175 is an aperture region, while the region 234 is a masked region. The region 234 covers the weight regions 19 and base regions 11 of the piezoelectric vibrating pieces 100 and prevents thinning of the metal film in the regions 19, 11.

The region 233 permits lamination of the first and second metal layers 531L, 531R in the grooves 13, and allows thinning of the second metal layers 532L, 532R (FIG. 1). As shown in FIG. 9B, the region 238 of the fourth mask cover 177 is an apertured region, while the region 239 is a masked region. The region 239 covers the weight regions 19, base regions 11, and side surfaces 24 (FIG. 1) of the piezoelectric vibrating pieces 100 and thus prevents thinning of the second metal layers in the weight region 19, base region 11, and the side surfaces 24. The region 238 permits thinning of the second metal layers 531L, 531R in the grooves 13.

In step S307 the second metal layers in the groove regions 13 or grooves 23 are thinned by dry-etching or the like performed in an inert-gas atmosphere (e.g., argon). As a result of thinning the second metal layer using the third mask cover 175 or fourth mask cover 177, the film thickness F1 of the second metal layer 531L, 531R in the grooves 13 (FIG. 1) is reduced to approximately 400 Å, for example. If the third mask cover 175 is used, the film thickness F4 of the second metal layers 532L, 532R on the side surfaces (FIG. 1) is also reduced, to an exemplary thickness of approximately 400 Å.

In step S308 the respective resonance frequencies and CI values of the piezoelectric vibrating pieces 100 on the piezoelectric wafer 150 are measured and adjusted as required.

In step S309 individual piezoelectric vibrating pieces 100 are cut from the piezoelectric wafer 150.

In this embodiment, as an alternative to thinning metal layers by dry-etching, the film thicknesses F1 and F4 can be reduced by laser irradiation.

Adjustment of Film Thickness F4 of Second Metal Layer on Axis Edge-Side Surfaces Adjusting the film thickness F4 is a way of adjusting the turnover temperature zero-temperature coefficient of the piezoelectric vibrating pieces 100. Adjustment of the turnover temperature zero-temperature coefficient is now described. By iterative experimentation, the connection between the turnover temperature zero-temperature coefficient, film thickness F1, and film thickness F4 was determined.

Figure 10A:
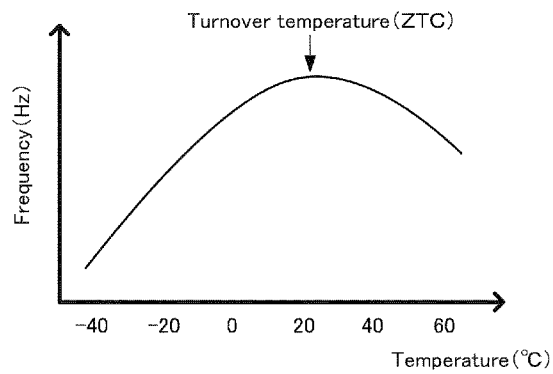
FIG. 10A is a graph showing an exemplary relationship of vibration frequency versus temperature.
Figure 10B:
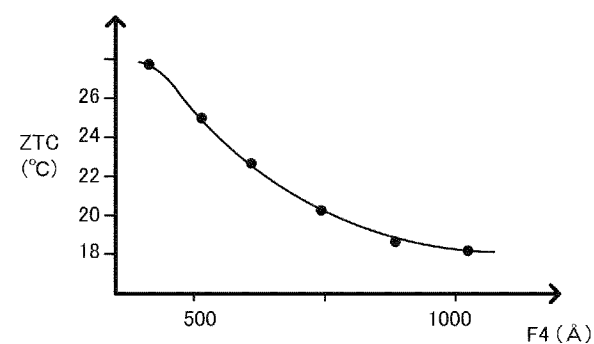
FIG. 10B is a graph showing an exemplary relationship of turnover temperature zero-temperature coefficient ("ZTC") versus film thickness F4 of the second metal layer on the axis edge-side surface of the first embodiment of a tuning-fork type piezoelectric vibrating piece.
Figure 10C:
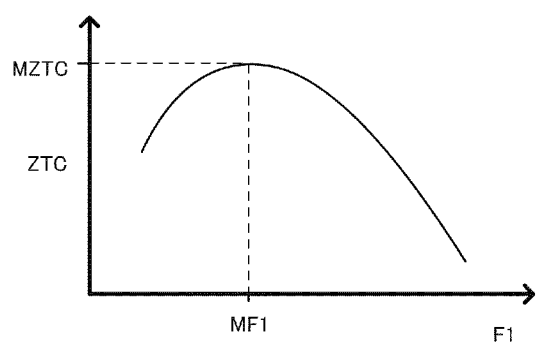
FIG. 10C is an exemplary relationship of turnover temperature zero-temperature coefficient versus film thickness F1 of the second metal layer in the groove of the first embodiment of a tuning-fork type piezoelectric vibrating piece.
Figure 10D:
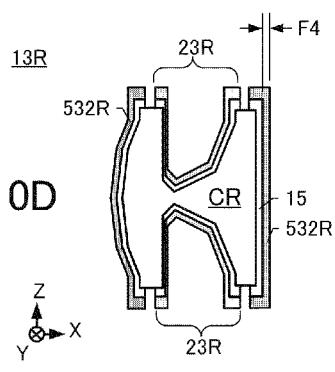
FIG. 10D is a schematic cross-section of the right groove area in a situation in which the film thickness F4 of the second metal layer on the axis edge-side surface is relatively low.
Figure 10E:
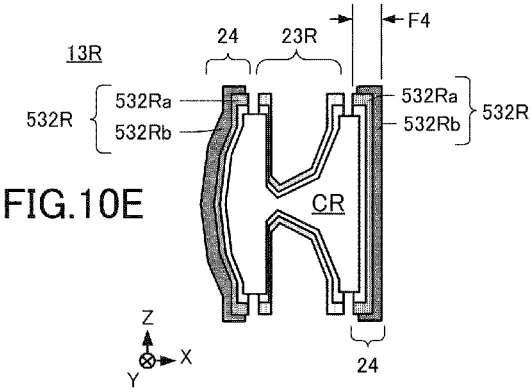
FIG. 10E is a schematic cross-section of the right groove area in a situation in which the film thickness F4 of the second metal layer on the axis edge-side surface is relatively high.

FIG. 10A is a graph of frequency versus temperature exhibited by the first embodiment of a tuning-fork type piezoelectric vibrating piece 100. FIG. 10B is a graph showing the relationship of turnover temperature zero-temperature coefficient to the film thickness F4 of the second metal layer 532L, 532R on the edge-side surfaces of the piezoelectric vibrating piece 100. FIG. 10C is a graph showing the relationship of turnover temperature zero-temperature coefficient to the film thickness F1 of the second metal layer 531L, 531R in the grooves 13L, 13R of the piezoelectric vibrating piece 100. FIG. 10D is a schematic cross-section of the right groove region 13R in a situation in which the film thickness F4 of the second metal layer 532R has been reduced. FIG. 10E is a schematic cross-section of the right groove region 13R in a situation in which the film thickness F4 has been increased.

In FIG. 10A the vibration frequency produced by the first embodiment of a tuning-fork type piezoelectric vibrating piece 100 exhibits a parabolic, quadratic relationship to temperature. The turnover temperature zero-temperature coefficient is the temperature at which the frequency produced by the piezoelectric vibrating piece 100 is highest. In FIG. 10A the turnover temperature zero-temperature coefficient is approximately 20° C.

As shown in FIG. 10B, the turnover temperature zero-temperature coefficient of the piezoelectric vibrating piece 100 changes with corresponding changes in the film thickness F4 of the second metal layer 532L, 532R on the axis edge-side surfaces. When the film thickness F4 is 750 Å, the turnover temperature zero-temperature coefficient is approximately 20° C. As also shown in FIG. 10B, when the film thickness F4 is 500 Å (FIG. 10D), the turnover temperature zero-temperature coefficient is approximately 25° C. On the other hand, when the film thickness F4 is 1000 Å (FIG. 10E), the turnover temperature zero-temperature coefficient is approximately 18° C. (FIG. 10B). I.e., the turnover temperature zero-temperature coefficient can be increased by reducing the film thickness F4 of the second metal layer 532L, 532R on the axis edge-side surfaces, and the turnover temperature zero-temperature coefficient can be decreased by increasing the film thickness F4. The turnover temperature zero-temperature coefficient plotted in FIG. 10B is measured by changing the film thickness F4 while keeping the film thickness F2 constant at 800 Å and while keeping the film thickness F1 of the second metal layer 531L, 531R constant.

In FIG. 10C the turnover temperature zero-temperature coefficient of the first embodiment of a tuning-fork type piezoelectric vibrating piece 100 exhibits a quadratic parabolic relationship relative to the film thickness F1 of the second metal layer 531L, 531R. The turnover temperature zero-temperature coefficient is maximum ("MZTC") when the film thickness F1 is MF1. The turnover temperature zero-temperature coefficient lowers with increasing difference between the film thickness F1 and MF1.

Due to causes such as a gap in the cut angles of the piezoelectric wafer 150 and production variations in the first embodiment of a tuning-fork type piezoelectric vibrating piece 100, the turnover temperature zero-temperature coefficient of a particular piezoelectric vibrating piece 100 may go out of alignment. In such event, the turnover temperature zero-temperature coefficient can be changed as required by adjusting the film thickness F1 or the film thickness F4. The film thickness F4 desirably is adjusted if only the turnover temperature zero-temperature coefficient is adjusted because CI is not changed by changing the film thickness F4 (FIG. 2B).

Figure 11:
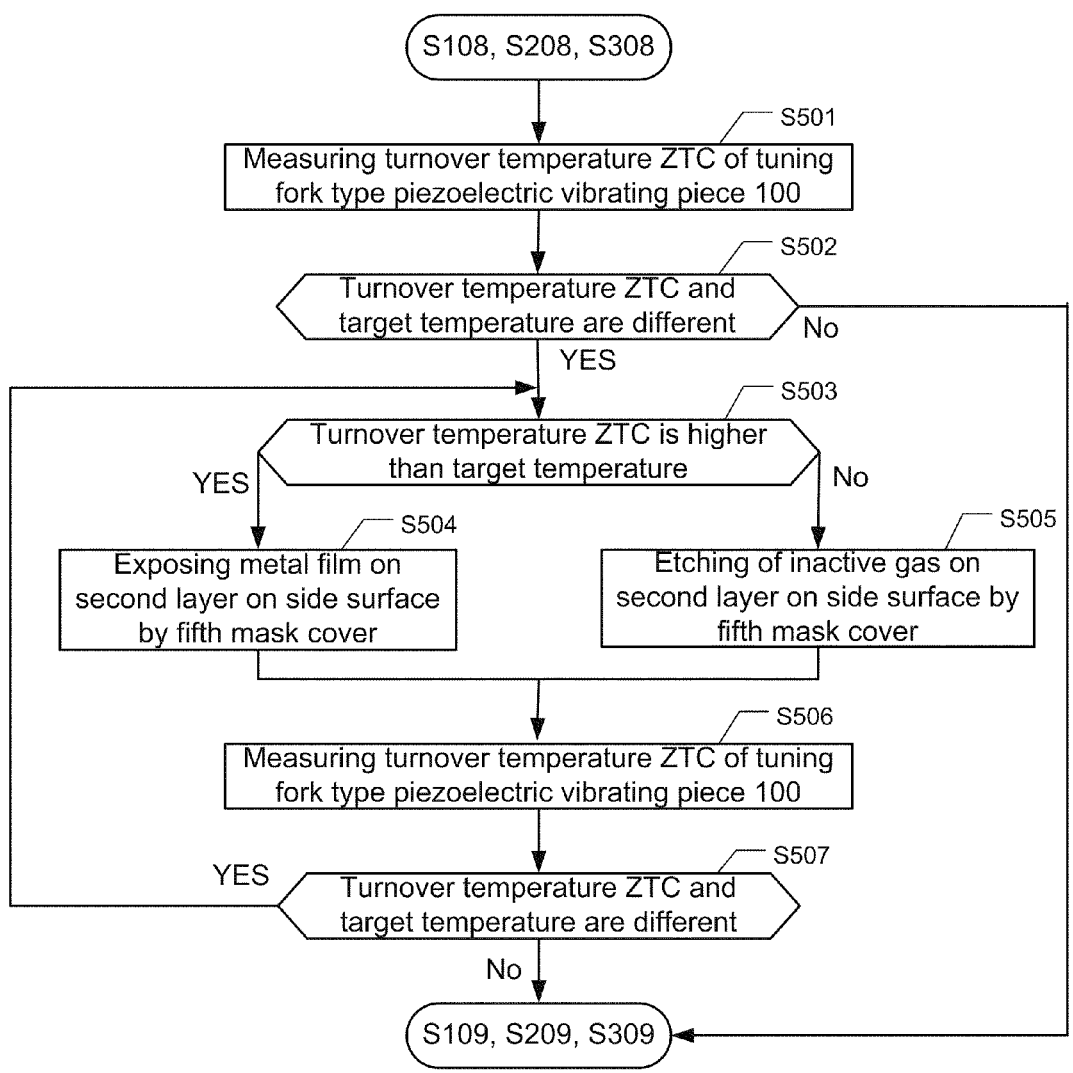
FIG. 11 is a flow-chart of an embodiment of a method for adjusting the turnover temperature zero-temperature coefficient of a tuning-fork type piezoelectric vibrating piece according to the first embodiment.

Embodiment of Method for Adjusting Turnover Temperature Zero-Temperature Coefficient In this method the turnover temperature zero-temperature coefficient of each tuning-fork type piezoelectric vibrating piece 100 on the piezoelectric wafer 150 is measured and the turnover temperature zero-temperature coefficient is correspondingly adjusted. FIG. 11 is a flow-chart of steps in an embodiment of this method. Adjustment of the turnover temperature zero-temperature coefficient can be performed, for example, between steps S108 and S109 of the method embodiment shown in FIG. 4. Similarly, measuring the turnover temperature can be performed between steps S208 and S209 of the embodiment shown in FIG. 5 or between steps S308 and S309 of the embodiment shown in FIG. 8.

Referring to FIG. 11, in step S501 the turnover temperature zero-temperature coefficient of a piezoelectric vibrating piece 100 formed on the piezoelectric wafer 150 is measured.

In step S502 a determination is made of whether the turnover temperature zero-temperature coefficient is different from a target temperature. The target temperature is established based on the expected usage environment of the piezoelectric vibrating piece 100. This is because vibration frequency shows the least sensitivity to changes in usage-environment temperature in the vicinity of the turnover temperature zero-temperature coefficient. The target temperature is set, for example, to 25° C. If the turnover temperature zero-temperature coefficient and the target temperature are equal, step S109 in FIG. 4, step S209 in FIG. 5, or step S309 in FIG. 8 is performed. If the turnover temperature zero-temperature coefficient is significantly different from the target temperature, then step S503 is performed.

In step S503 a determination is made of whether the turnover temperature zero-temperature coefficient is higher than the target temperature. Step S504 is performed if the turnover temperature zero-temperature coefficient is indeed higher than the target temperature, and step S505 is performed if the turnover temperature zero-temperature coefficient is lower than the target temperature.

Figure 12:
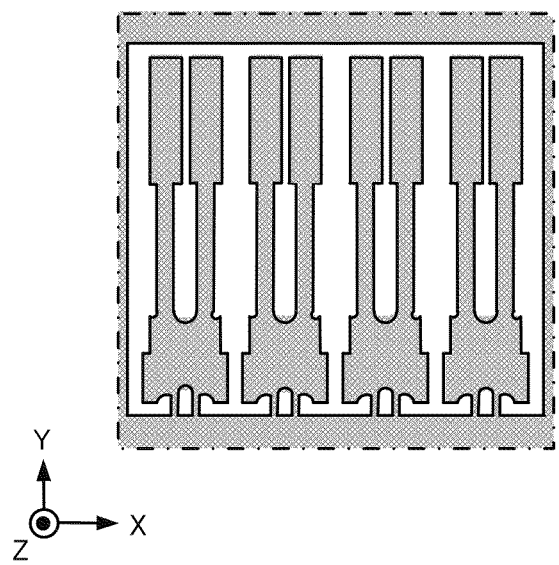
FIG. 12 is an enlargement of a region of the fifth mask cover used, for example, in the method shown in FIG. 11.

In step S504, using the fifth mask cover 179 as shown in FIG. 12, a metal film is formed on the second metal layer 532L, 532R on the axis edge-side surface by vacuum-deposition or sputtering. The fifth mask cover 179 defines the Z-axis side surfaces of the piezoelectric vibrating piece 100, and is placed so that it registers with the region 160 (enlarged in FIG. 6B) of the piezoelectric wafer 150. Hence, whenever the fifth mask cover 179 is used, the principal surface of the tuning-fork type piezoelectric vibrating piece 100 is covered; only the second metal layer 532L, 532R on the axis edge-side surfaces are not covered, allowing metal to be deposited on them or removed from them.

To determine the film thickness of the metal film, graphs such as FIG. 10B are prepared. From the data in such graphs, a graph is selected that depicts the closest relationship between turnover temperature zero-temperature coefficient and film thickness F4 of the second metal layer 532L, 532R on the axis edge-side surfaces. From the selected graph, a determination is made of a desired amount of second metal layer. For example, if the actual turnover temperature zero-temperature coefficient is 26° C. and the target turnover temperature is 25° C., FIG. 10B indicates that the film thickness F4 of the second metal layer on the axis edge-side surface should be approximately 50 Å.

In step S505 using the fifth mask cover 179 shown in FIG. 12, the second metal layer on the axis edge-side surfaces 532L, 532R are dry-etched in an inert-gas atmosphere, such as an argon atmosphere. Using the fifth mask cover 179, only the second metal layers 532 on the axis edge-side surfaces 532 are thinned without affecting the principal surface of the tuning-fork type piezoelectric vibrating piece 100.

In step S506 the turnover temperature zero-temperature coefficient of the piezoelectric vibrating piece 100 is confirmed. In step S507 a determination is made of whether the turnover temperature zero-temperature coefficient and the target temperature are different. If they are different, the process returns to step S503, and the turnover temperature zero-temperature coefficient is readjusted. If the temperatures are equal, then step S109 (FIG. 4), step S209 (FIG. 5) or step S309 (FIG. 8) is performed.

Second Embodiment of a Tuning-Fork Type Piezoelectric Vibrating Piece

In this embodiment 200 the second metal layer in the grooves of the vibrating arms differs in form from corresponding second metal layers in the first embodiment of a tuning-fork type piezoelectric vibrating piece 100. These second metal layers in the second embodiment can be made thicker to decrease CI. Also, the thickness of the second metal layers on the axis edge-side surfaces of the vibrating arms can be adjusted to make corresponding changes in the turnover temperature zero-temperature coefficient.

FIG. 13A is a plan view of the second embodiment of a tuning fork type piezoelectric vibrating piece 200. This embodiment comprises a base 11 and a pair of vibrating arms 12 extending parallel to each other in the Y-axis direction from the base 11. The piezoelectric vibrating piece 200 also includes a pair of pair of supporting arms 86, wherein a respective supporting arm 86R, 86L extends in the Y-axis direction outboard of the respective vibrating arm 12.

Each supporting arm 86L, 86R includes a respective electrode 85L, 85R each comprising first and second metal layers as described above. The right-hand supporting arm 86R includes a respective electrode 85R, and the left-hand supporting arm 86l includes a respective electrode 85L. The respective second metal layers of the supporting-arm electrodes 85R, 85L extend in the Y-axis direction from the base 11 to near the respective distal ends of the supporting arms 86R, 86L. These second metal layers of the supporting-arm electrodes 85R, 85L are connected to respective second metal layers 51R, 51L on the base 11 that extend from respective excitation electrodes. The distal region of each supporting-arm electrode 85R, 85L serves as a respective connecting electrode. The connecting electrodes are electrically connected, using electrically conductive adhesive 73 or solder, inside the package 80 (FIG. 13C).

FIG. 13B is a cross-section of the second embodiment of a piezoelectric vibrating piece 200 along the line G-G in FIG. 13A. As in the first embodiment, in the second embodiment, CI is kept reduced by forming the film thickness F5 of the second metal layer of the supporting-arm electrode 85 greater than the film thickness F6 of the second metal layer in the grooves and greater than the film thickness F7 of the second metal layer on the axis edge-side surfaces. The film thickness F5 is desirably in the range of 500 Å to 2000 Å. The film thicknesses F6 and F7 are desirably in the range of approximately 300 Å to 800 Å.

The second metal layer of the supporting-arm electrodes 85R, 85L (excluding the distal-end region) can be as thin as the film thickness F6 or the film thickness F7, or can be equal to the film thickness F5 of the distal-end region. Also, the second metal layers in the regions 51R, 51L of the base 11 of the second embodiment can be as thick as the film thickness F6 or the film thickness F7, or can be equal to the film thickness F5 of the distal-end region.

Also, as in the first embodiment 100, in the second embodiment 200 the turnover temperature zero-temperature coefficient can be adjusted by adjusting the film thickness F7 of the second metal layer on the axis edge-side surfaces.

FIG. 13C is a top-down view of a piezoelectric device 2000 comprising the second embodiment of a tuning-fork type piezoelectric vibrating piece 200. The piezoelectric vibrating piece 200 is mounted in and electrically connected to the package 80 of the piezoelectric device 2000, using electrically-conductive adhesive 73 applied to connecting electrodes 87 formed near the distal ends of the supporting arms 85R, 85L, respectively. By connecting the piezoelectric vibrating piece 200 to the package 80 using the supporting arms 86R, 86L a distance can be imposed between the fixed part of the package 80 and the vibrating arms 12. Such a configuration reduces adverse influences on the vibrating arms 12L, 12R of changes in ambient temperature, impacts from dropping the device, stress changes in connected parts, etc. For this reason, the second embodiment of a tuning fork type piezoelectric vibrating piece 200 exhibits better temperature characteristics than the first embodiment 100.

Third Embodiment of Tuning-Fork Type Piezoelectric Vibrating Piece

Even with a tuning-fork type piezoelectric vibrating piece not housed in a ceramic package, the thickness of the second metal layer on axis edge-side surfaces of the vibrating arms can be adjusted to make corresponding adjustments in the turnover temperature zero-temperature coefficient.

FIG. 14 A is a plan view of a third embodiment of a tuning-fork type piezoelectric vibrating piece 300. The third embodiment 300 comprises a pair of vibrating arms 12 extending parallel to each other in the Y-axis direction from a base 11. Outboard of each vibrating arm is a respective supporting arm 306 extending first outward (in the X-axis direction) from the base 11 and then in the Y-axis direction. The supporting arms then extend further outward in the X-axis direction to connect to a frame portion 310 of the piezoelectric vibrating piece 310. Thus, the supporting arms 306 connect the frame portion 310 to the base 11. The frame portion 310 circumferentially surrounds the base 11, the vibrating arms 12, and the supporting arms 306 inside the package. The frame portion 310 is connected to a lid 90 and base plate 120 as shown in FIG. 14B.

Respective electrodes are formed over the respective regions extending from each excitation electrode 307 on the vibrating arms 12 to the frame portion 310. These electrodes are configured similar to corresponding electrodes of the first embodiment 100 of a piezoelectric vibrating piece, namely a first metal layer 15 formed on the piezoelectric material CR and a second metal layer 311 formed on the first metal layer (FIG. 14C). Thus, a respective second metal layer 311R, 311L is formed on each first metal layer 15 to form respective electrodes 311. The electrodes 311 extend down the respective supporting arms to their respective termini connected to the frame portion 310. These electrodes 311 serve as respective connecting electrodes.

FIG. 14B is a schematic cross-section of the piezoelectric device 3000 along the line K-K in FIG. 14A before assembly. The piezoelectric device 3000 comprises a lid 90, a base plate 120 and the third embodiment 300 of a tuning-fork type piezoelectric vibrating piece. The lid 90 is placed on the +Z side of the piezoelectric device 3000 such that a concavity 91 in the lid faces the piezoelectric vibrating piece 300 in the package. The base plate 120 is placed on the −Z side of the piezoelectric device 3000 such that a concavity 121 in the base plate 121 faces the piezoelectric vibrating piece 300. Two opposing corners on the +Z-axis side of the base plate 120 include a recessed ledge 129 that includes a respective connecting terminal 122. Corresponding relay terminals 125 are situated outside on the respective corners of the −Z-axis surface of the base plate 120. The connecting terminals 122 and relay terminals 125 are connected electrically via respective through-hole 123. The piezoelectric vibrating piece 300 is placed between the lid 90 and the base plate 120.

Respective connecting electrodes 317 are provided near the distal end of each supporting arm. Thus, the piezoelectric vibrating piece 300 is electrically connected to the connecting terminals 122 formed on the base plate 120 and also electrically connected to the relay terminals 125 via conductors 126 extending through respective through-holes 123.

Inside the piezoelectric device 3000 is a space defined in part by the concavities 91, 121 in the lid and base plate, respectively. The piezoelectric device 3000 is configured so that the vibrating arms 12 do not contact the lid 90 or the base plate 120, even while the arms are oscillating in the Z-axis direction.

The lid 90, base plate 120, and piezoelectric vibrating piece 300 can be formed of a crystal material (e.g., quartz crystal). In such a configuration the lid 90, base plate 120, and piezoelectric vibrating piece 300 are connected together by siloxane bonds (Si—O—Si). Siloxane bonding allows crystal pieces to be bonded together directly and does not require any use of sealant. This type of bonding also allows the electrodes 311 to be bonded directly to respective connecting terminals 122 without the use of electrically-conductive adhesive.

FIG. 14C is a schematic cross-section of the third embodiment of a tuning-fork type piezoelectric vibrating piece 300, along the line H-H in FIG. 14A. The vibrating arms 12 of this embodiment have the same configuration as the vibrating arms 12 of the first embodiment 100. Each supporting arm 306 is outboard of the respective vibrating arm 12 and inboard of the frame region 310. As in the first embodiment 100, the turnover temperature zero-temperature coefficient of the third embodiment 300 can be adjusted by adjusting the film thickness F8 of the second metal layer 316 on the axis edge-side surfaces of the vibrating arms 12.

The invention has been described above in the context of preferred embodiments. It will be understood by those of ordinary skill in the art that the invention is not limited to those embodiment and can be varied and/or modified within the scope of this invention.

What is claimed is:

1. A tuning-fork type piezoelectric vibrating piece, comprising:
   a connecting electrode electrically connectable to an internal conductive member of a package; and
   a base and a pair of vibrating arms made of a piezoelectric material, the vibrating arms extending in a prescribed direction from the base and comprising at least one excitation electrode electrically connected to the connecting electrode, each vibrating arm comprising upper and lower main surfaces each defining a respective groove extending in the prescribed direction, and each vibrating arm comprising edge-side surfaces extending between the first and second main surfaces;
   wherein the excitation electrode includes a surface electrode located inside the grooves on the main surfaces of at least one vibrating arm and a side electrode located on the edge-side surfaces of the at least one vibrating arm;
   wherein the connecting electrode and the at least one excitation electrode each comprise a first metal layer formed on the piezoelectric material and a second metal layer formed on the first metal layer; and
   wherein the second metal layer thickness of the surface electrode is 30% to 80% of the second metal layer thickness of the connecting electrode.

2. The piezoelectric vibrating piece of claim 1, wherein the connecting electrode is situated on the base.

3. The piezoelectric vibrating piece of claim 1, further comprising a pair of supporting arms, each supporting arm extending in the prescribed direction from the base outboard of the respective vibrating arm, each supporting arm comprises a distal end that includes a respective connecting electrode.

4. The piezoelectric vibrating piece of claim 2, further comprising a pair of supporting arms, each supporting arm extending in the prescribed direction from the base outboard of the respective vibrating arm, each supporting arm comprises a distal end that includes a respective connecting electrode.

5. The piezoelectric vibrating piece of claim 1, wherein the surface electrodes are thinned, after their initial formation, by etching in an inert gas atmosphere, by laser irradiation, or by metal etching.

6. The piezoelectric vibrating piece of claim 2, wherein the surface electrodes are thinned, after their initial formation, by etching in an inert gas atmosphere, by laser irradiation, or by metal etching.

7. A piezoelectric device, comprising:
   a tuning-fork type piezoelectric vibrating piece as recited in claim 1; and
   a package housing the tuning-fork type piezoelectric vibrating piece.

\* \* \* \* \*